United States Patent
Wang

(10) Patent No.: US 11,085,797 B2
(45) Date of Patent: Aug. 10, 2021

(54) ROTATION DETECTING DEVICE, ENCODER, AND MOTOR

(71) Applicant: DELTA ELECTRONICS, INC., Taoyuan (TW)

(72) Inventor: Horng-Jou Wang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 36 days.

(21) Appl. No.: 16/295,789

(22) Filed: Mar. 7, 2019

(65) Prior Publication Data
US 2020/0141764 A1    May 7, 2020

(30) Foreign Application Priority Data
Nov. 1, 2018 (CN) .......................... 201811296105.0

(51) Int. Cl.
*G01D 5/249* (2006.01)
*G01R 33/00* (2006.01)
*G01D 5/14* (2006.01)
*H02K 11/215* (2016.01)

(52) U.S. Cl.
CPC ............ *G01D 5/2497* (2013.01); *G01D 5/14* (2013.01); *G01R 33/0011* (2013.01); *H02K 11/215* (2016.01)

(58) Field of Classification Search
CPC ........ G01D 5/14; G01D 5/2497; G01D 5/145; G01R 33/0011; G01R 33/0005; H02K 11/215
See application file for complete search history.

(56) References Cited

U.S. PATENT DOCUMENTS 4,283,679 A * 8/1981 Ito ........................... G01P 13/04
324/165
5,880,586 A * 3/1999 Dukart ................... G01D 5/145
324/207.2

(Continued)

FOREIGN PATENT DOCUMENTS

CN  103925933 A  7/2014
CN  107725273 A  2/2018

(Continued)

*Primary Examiner* — Jay Patidar
(74) *Attorney, Agent, or Firm* — Kirton McConkie; Evan R. Witt

(57) ABSTRACT

A rotation detecting device includes a magnet, a first magnetic sensing assembly and a second magnetic sensing assembly. The magnet is rotatable about a rotation axis. As the magnet is rotated for one turn, a magnetic characteristic of the magnet is correspondingly changed for a cycle. The first magnetic sensing assembly is located over the magnet, wherein the rotation axis of the magnet passes through the first magnetic sensing assembly. A first lengthwise direction of the first magnetic sensing assembly is in parallel with a rotation radius direction of the magnet. The second magnetic sensing assembly is arranged beside the first magnetic sensing assembly. A second lengthwise direction of the second magnetic sensing assembly is in parallel with a rotation tangential direction of the magnet. An included angle between the second lengthwise direction and the first lengthwise direction is (90+θ) degrees, wherein −30≤θ≤30.

13 Claims, 12 Drawing Sheets

(56) References Cited

U.S. PATENT DOCUMENTS

| | | | | |
|---|---|---|---|---|
| 6,104,186 | A * | 8/2000 | Yamada | F02P 7/07 |
| | | | | 324/174 |
| 2009/0278531 | A1* | 11/2009 | Franke | H02P 6/17 |
| | | | | 324/207.2 |
| 2015/0130450 | A1* | 5/2015 | Gehringer | G01D 5/3473 |
| | | | | 324/207.25 |
| 2015/0369636 | A1* | 12/2015 | Deak | G01D 5/2497 |
| | | | | 324/207.21 |
| 2018/0087888 | A1* | 3/2018 | Ausserlechner | G01D 5/145 |
| 2019/0186955 | A1* | 6/2019 | Wallrafen | G01D 5/145 |

FOREIGN PATENT DOCUMENTS

| | | |
|---|---|---|
| CN | 107869952 A | 4/2018 |
| CN | 207717105 U | 8/2018 |
| JP | 200814799 A | 1/2008 |
| TW | 201623921 A | 7/2016 |

* cited by examiner

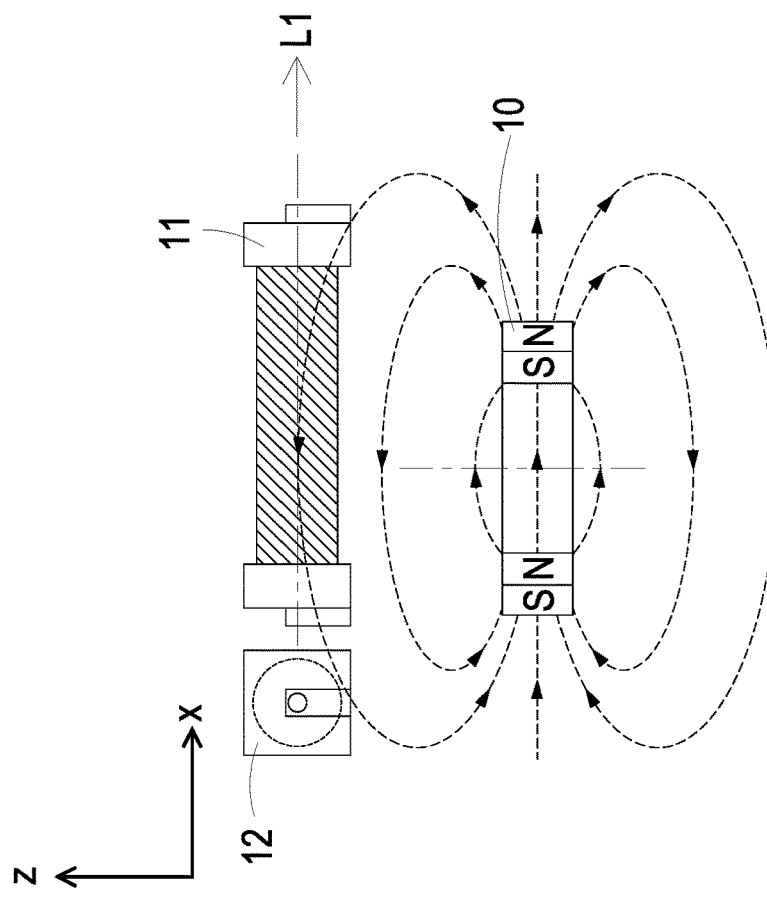
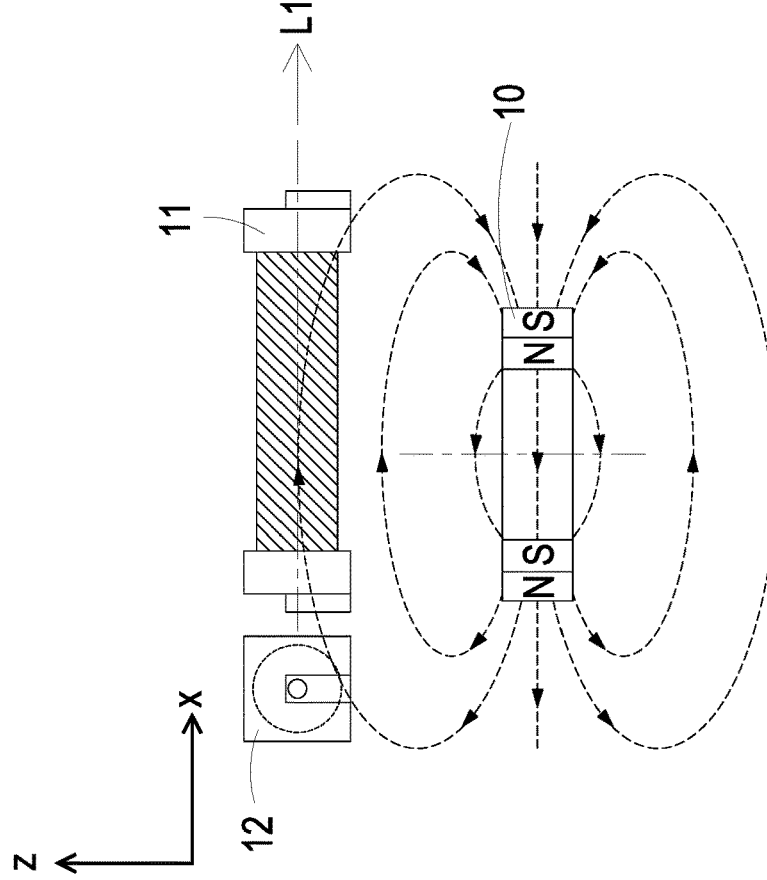
FIG. 7A
FIG. 7B

ROTATION DETECTING DEVICE, ENCODER, AND MOTOR

FIELD OF THE INVENTION

The present disclosure relates to a rotation detecting device, and more particularly to a rotation detecting device for acquiring the rotation information of a magnet according to a result of sensing the magnetic characteristic changes of the rotating magnet and generating a voltage pulse signal by a first magnetic sensing assembly and a second magnetic sensing assembly. The present disclosure also relates to an encoder and a motor using the rotation detecting device.

BACKGROUND OF THE INVENTION

Generally, a rotary device such as a rotation encoder or a motor is equipped with a rotation detector. According to a photoelectric principle or an electromagnetic principle, the mechanical displacement amount is converted into an electronic signal. According to the electronic signal, the turn number or the rotation status of the rotary device is detected.

Conventionally, the rotation detector includes a magnet and a plurality of magnetic field sensors. The plurality of magnetic field sensors are arranged along the tangential directions of a circular rotation trajectory of the magnet, or the plurality of magnetic field sensors are arranged along a rotation circumference at different phase angles. By detecting the changes of the magnetic field, the plurality of magnetic field sensors acquire the rotation information of the magnet.

However, the conventional rotation detector still has some drawbacks. For example, the conventional rotation detector has many components, and the structure of the conventional rotation detector is complicated. In addition, the arrangement of the plurality of magnetic field sensors needs a lot of plane space. The increased volume of the rotation detector occupies a lot of space and is detrimental to the miniaturization of the rotary device.

For overcoming the drawbacks of the conventional technologies, there is a need of providing an improved rotation detecting device and an encoder and a motor with the rotation detecting device.

SUMMARY OF THE INVENTION

An object of the present disclosure provides a rotation detecting device and an encoder and a motor using the same to address the issues encountered by the prior arts.

Another object of the present disclosure provides a rotation detecting device with a simplified structure to acquire the accurate rotation status information of a rotating magnet. Consequently, the volume and the occupied space of the rotation detecting device are reduced. In addition, the present disclosure also provides an encoder with the rotation detecting device and a motor with the rotation detecting device.

In accordance with an aspect of the present disclosure, there is provided a rotation detecting device. The rotation detecting device includes a magnet, a first magnetic sensing assembly and a second magnetic sensing assembly. The magnet is rotatable about a rotation axis and has a magnetic characteristic. As the magnet is rotated for one turn, the magnetic characteristic of the magnet is correspondingly changed for a cycle. The first magnetic sensing assembly is located over the magnet. The rotation axis of the magnet passes through the first magnetic sensing assembly. A first lengthwise direction of the first magnetic sensing assembly is in parallel with a rotation radius direction of the magnet. The second magnetic sensing assembly is arranged beside the first magnetic sensing assembly. A second lengthwise direction of the second magnetic sensing assembly is in parallel with a rotation tangential direction of the magnet. An included angle between the second lengthwise direction and the first lengthwise direction is $(90+\theta)$ degrees, wherein $-30 \leq \theta \leq 30$. While the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal.

In accordance with another aspect of the present disclosure, there is provided an encoder. The encoder includes a carrier disc, a magnet, an encoding disc, a single-turn absolute-type position sensor, a first magnetic sensing assembly and a second magnetic sensing assembly. The magnet is installed on the carrier disc and has a magnetic characteristic. As the magnet is rotated for one turn, the magnetic characteristic of the magnet is correspondingly changed for a cycle. The encoding disc is installed on the carrier disc and arranged around the magnet. The carrier disc, the encoding disc and the magnet are coaxial and rotatable about a rotation axis. The single-turn absolute-type position sensor is aligned with the encoding disc and the magnet. While the encoding disc and the magnet are rotated, the single-turn absolute-type position sensor senses rotations of the encoding disc and the magnet and generates a single-turn absolute position signal. The first magnetic sensing assembly is located over the magnet. The rotation axis of the magnet passes through the first magnetic sensing assembly. A first lengthwise direction of the first magnetic sensing assembly is in parallel with a rotation radius direction of the magnet. The second magnetic sensing assembly is arranged beside the first magnetic sensing assembly. A second lengthwise direction of the second magnetic sensing assembly is in parallel with a rotation tangential direction of the magnet. An included angle between the second lengthwise direction and the first lengthwise direction is $(90+\theta)$ degrees, wherein $-30 \leq \theta \leq 30$. While the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal.

In accordance with a further aspect of the present disclosure, there is provided a motor. The motor includes a frame body, a rotation shaft, a rotor, a stator, a carrier disc, a magnet, an encoding disc, a single-turn absolute-type position sensor, a first magnetic sensing assembly and a second magnetic sensing assembly. The rotation shaft is penetrated through the frame body and arranged along a rotation axis. The rotor is sheathed around the rotation shaft. The stator is disposed on the frame body and aligned with the rotor. The carrier disc is disposed on the rotation shaft. The magnet is installed on the carrier disc and has a magnetic characteristic. As the magnet is rotated for one turn, the magnetic characteristic of the magnet is correspondingly changed for a cycle. The encoding disc is installed on the carrier disc and arranged around the magnet. The carrier disc, the encoding disc and the magnet are coaxial and rotatable about the rotation axis. The single-turn absolute-type position sensor is aligned with the encoding disc and the magnet. While the encoding disc and the magnet are rotated, the single-turn absolute-type position sensor senses rotations of the encoding disc and the magnet and generates a single-turn absolute position signal. The first magnetic sensing assembly is located over the magnet. The rotation axis of the magnet passes through the first magnetic sensing assembly. A first lengthwise direction of the first magnetic sensing assembly is in parallel with a rotation radius direction of the magnet. The second magnetic sensing assembly is arranged beside the first magnetic sensing assembly. A second lengthwise direction of the second magnetic sensing assembly is in parallel with a rotation tangential direction of the magnet. An included angle between the second lengthwise direction and the first lengthwise direction is (90+θ) degrees, wherein −30≤θ≤30. While the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal.

In an embodiment, the rotation detecting device includes a first magnetic sensing assembly and a second magnetic sensing assembly. An included angle between a first lengthwise direction of the first magnetic sensing assembly and a second lengthwise direction of the second magnetic sensing assembly is in the range between 60 degrees and 120 degrees. The rotation detecting device has a simplified structure to acquire the actuate rotation status information of a rotating magnet. Consequently, the volume and the occupied space of the rotation detecting device are reduced.

In an embodiment, the rotation detecting device includes a first magnetic sensing assembly and a second magnetic sensing assembly. When the rotation angle of the magnet is (90+θ) degrees or (270+θ) degrees, the first magnetic sensing assembly generates the first voltage pulse signal. When the rotation angle of the magnet is 0 degree or 180 degrees, the second magnetic sensing assembly generates the second voltage pulse signal. After the first voltage pulse signal and the second voltage pulse signal are processed, the precise rotation information of the magnet is obtained.

In an embodiment, the rotation detecting device includes a first magnetic sensing assembly and a second magnetic sensing assembly. The rotation detecting device includes an electric power adjusting circuit and a storage unit. The voltage pulse signals are provided to the electric power adjusting circuit and the signal processor. The rotation information of the magnet is temporarily stored in the storage unit. Consequently, it is not necessary to apply external electric power to detect the rotation of the magnet.

In an embodiment, each of the encoder and the motor includes a single-turn absolute-type position sensor, a first magnetic sensing assembly and a second magnetic sensing assembly. The single-turn absolute position information is generated by the single-turn absolute-type position sensor. The rotation information of the magnet is obtained by the first magnetic sensing assembly and the second magnetic sensing assembly. According to the combination of the rotation information and the single-turn absolute position information, the multi-turn absolute position information is more precise.

The above contents of the present disclosure will become more readily apparent to those ordinarily skilled in the art after reviewing the following detailed description and accompanying drawings, in which:

BRIEF DESCRIPTION OF THE DRAWINGS

FIG. 7A is a schematic side view illustrating the magnetic flux density distribution of the rotation detecting device, in which the rotation angle of the magnet is 0 degree;

FIG. 7B is a schematic side view illustrating the magnetic flux density distribution of the rotation detecting device, in which the rotation angle of the magnet is 180 degrees;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1B:
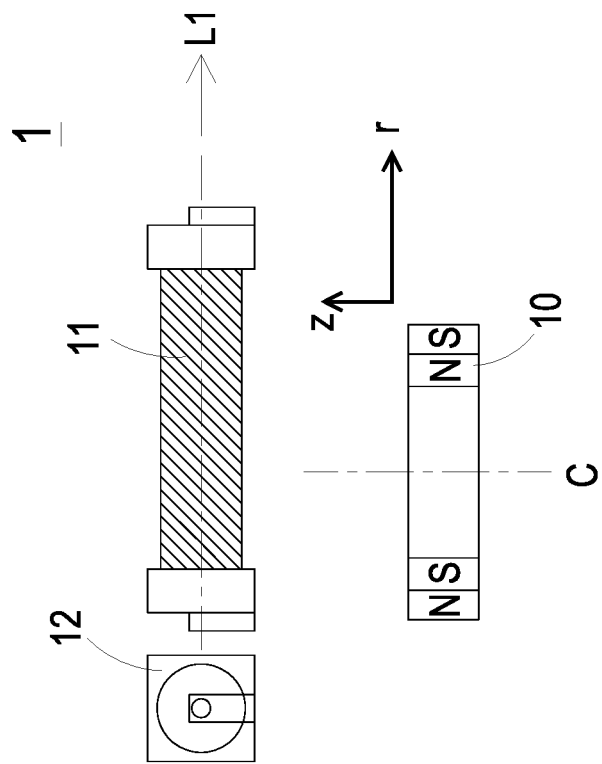
FIG. 1B is a schematic side view illustrating the rotation detecting device as shown in FIG. 1A.
Figure 1A:
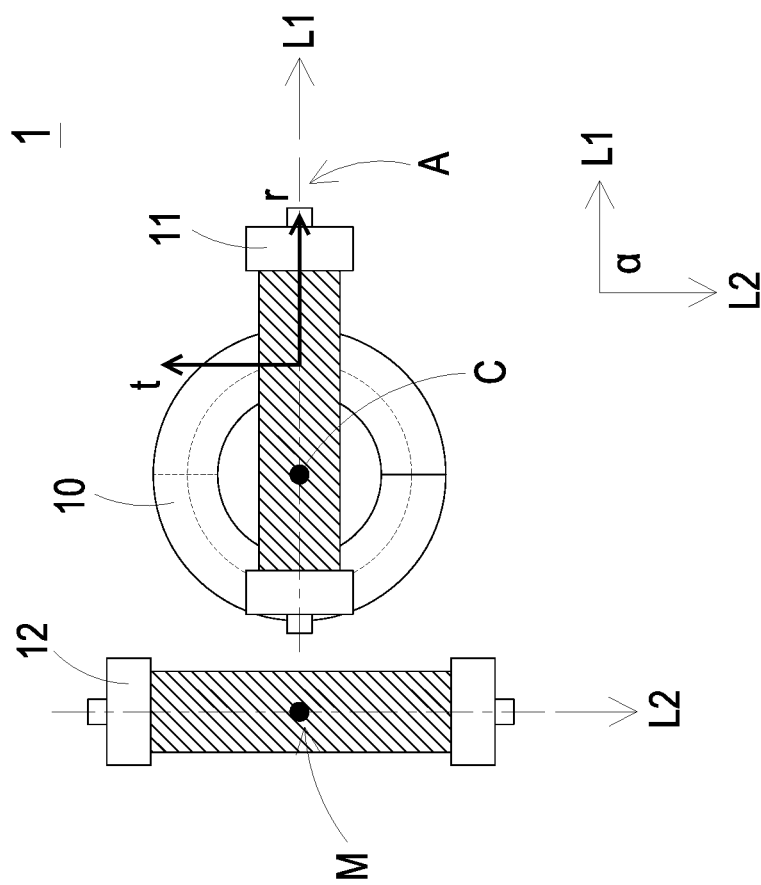
FIG. 1A is a schematic top view illustrating a rotation detecting device according to an embodiment of the present disclosure.
Figure 3:
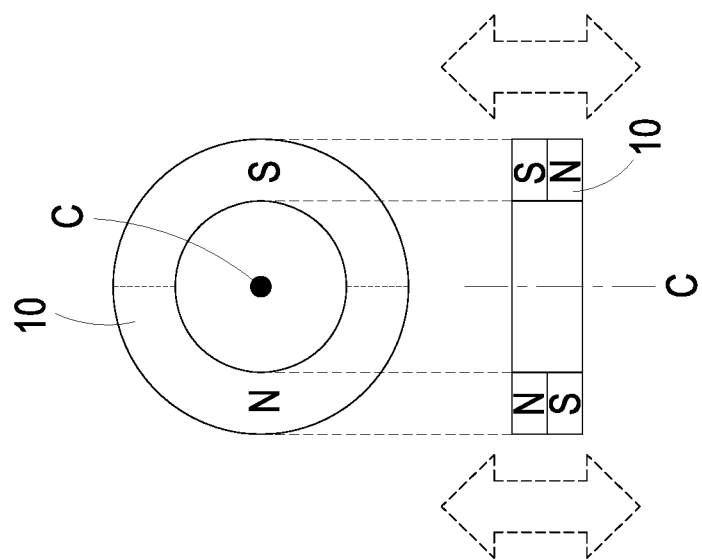
FIG. 3 schematically illustrates the top view and the side view of another exemplary magnet of the rotation detecting device according to the embodiment of the present disclosure.
Figure 2:
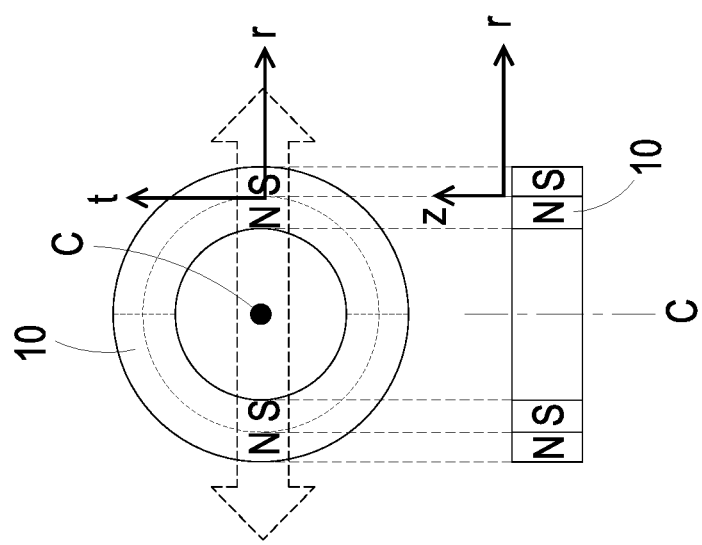
FIG. 2 schematically illustrates the top view and the side view of an exemplary magnet of the rotation detecting device according to the embodiment of the present disclosure.

Please refer to FIGS. 1A, 1B, 2 and 3. FIG. 1A is a schematic top view illustrating a rotation detecting device according to an embodiment of the present disclosure. FIG. 1B is a schematic side view illustrating the rotation detecting device as shown in FIG. 1A. FIG. 2 schematically illustrates the top view and the side view of an exemplary magnet of the rotation detecting device according to the embodiment of the present disclosure. FIG. 3 schematically illustrates the top view and the side view of another exemplary magnet of the rotation detecting device according to the embodiment of the present disclosure.

The rotation detecting device 1 includes a magnet 10, a first magnetic sensing assembly 11 and a second magnetic sensing assembly 12. The first magnetic sensing assembly 11 and the second magnetic sensing assembly 12 are arranged along a thickness direction z of the magnet 10. The magnet 10 is rotatable about a rotation axis C. Moreover, the magnet 10 has magnetic characteristics. As the magnet 10 is rotated for one turn (i.e., rotated from 0 to 360 degrees), the magnetic characteristics are correspondingly changed for a cycle. The magnetic characteristics include the magnetic flux or the magnetic field strength. An example of the magnet 10 includes but is not limited to a ring-shaped magnet, a circular plate-type magnet or a rectangular magnet. As long as the magnetic characteristics are correspondingly changed for one cycle in response to the one-turn rotation, the type of the magnet 10 is not restricted.

In some embodiments, as shown in FIG. 2, the magnet 10 is radially magnetized along a rotation radius direction r. In some embodiments, as shown in FIG. 3, the magnet 10 is axially magnetized along a thickness direction z. It is noted that the direction of magnetizing the magnet 10 is not restricted.

The first magnetic sensing assembly 11 is located over the magnet 10 and the rotation axis C of the magnet 10 passes through the first magnetic sensing assembly 11. A first lengthwise direction L1 of the first magnetic sensing assembly 11 is in parallel with the rotation radius direction r of the magnet 10. The second magnetic sensing assembly 12 is arranged beside the first magnetic sensing assembly 11. A second lengthwise direction L2 of the second magnetic sensing assembly 12 is in parallel with a rotation tangential direction t of the magnet 10. Moreover, an included angle α between the second lengthwise direction L2 and the first lengthwise direction L1 is (90+θ) degrees, wherein −30≤θ≤30.

In this context, the first lengthwise direction L1 is the direction extended along the length of the first magnetic sensing assembly 11, the second lengthwise direction L2 is the length extended along the length of the second magnetic sensing assembly 12, the rotation radius direction r is the radius direction of the magnet 10 when the magnet 10 is rotated about the rotation axis C, and the rotation tangential direction t is the direction tangential direction to the rotation trajectory of the magnet 10 upon rotation about the rotation axis C.

While the magnet 10 is rotated about the rotation axis C, the first magnetic sensing assembly 11 senses the magnetic characteristic changes of the magnet 10. According to the magnetic characteristic changes of the magnet 10, the first magnetic sensing assembly 11 generates a first voltage pulse signal. While the magnet 10 is rotated about the rotation axis C, the second magnetic sensing assembly 12 senses the magnetic characteristic changes of the magnet 10. According to the magnetic characteristic changes of the magnet 10, the second magnetic sensing assembly 12 generates a second voltage pulse signal. After the first voltage pulse signal and the second voltage pulse signal are processed by a back-end circuit, a rotation information about the magnet 10 is obtained. The rotation information contains the information about the turn number of rotating the magnet 10 and the rotation direction of the magnet 10.

In some embodiments, the first magnetic sensing assembly 11 has a center axis A along the first lengthwise direction L1. The first magnetic sensing assembly 11 is located over the magnet 10 and the rotation axis C of the magnet 10 passes through the first magnetic sensing assembly 11. There is an intersection point between the center axis A of the first magnetic sensing assembly 11 and the rotation axis C. Namely, the center axis A passes through the extension of the rotation axis C, wherein the extension of the rotation axis C means that any position located at the extension line of the rotation axis C. Moreover, the second magnetic sensing assembly 12 has a central point M, and the center axis A of the first magnetic sensing assembly 11 passes through the central point M of the second magnetic sensing assembly 12. Namely, the extension of the center axis A of the first magnetic sensing assembly 11 passes through the central point M of the second magnetic sensing assembly 12, wherein the extension of the center axis A means that any position located at the extension line of the center axis A.

In an embodiment, the first magnetic sensing assembly 11 and the second magnetic sensing assembly 12 are arranged in a T-shaped configuration. In an embodiment, the included angle α between the second lengthwise direction L2 of the second magnetic sensing assembly 12 and the first lengthwise direction L1 of the first magnetic sensing assembly 11 is 90 degrees. That is, θ is zero, and the second lengthwise direction L2 is perpendicular to the first lengthwise direction L1. Since the positions of the first magnetic sensing assembly 11 and the second magnetic sensing assembly 12 are specially determined, the acquired rotation information is more precise.

In an embodiment, each of the first magnetic sensing assembly 11 and the second magnetic sensing assembly 12 includes a magnetic element and a coil. The magnetic element is capable of generating a large Barkhausen effect. For example, each of the first magnetic sensing assembly 11 and the second magnetic sensing assembly 12 is a Wiegand wire, a composite magnetic wire or an amorphous wire. The large Barkhausen effect is also referred as a large Barkhausen jump. The large Barkhausen jump is the phenomenon that magnetization reversal occurs rapidly when the external magnetic field reaches the critical field. When the first magnetic sensing assembly 11 and the second magnetic sensing assembly 12 sense the magnetic characteristic changes of the magnet 10 (the changes of the magnetic flux density or the magnetic field strength), the large Barkhausen jump occurs. Consequently, the magnetic characteristic changes are converted into the first voltage pulse signal and the second voltage pulse signal. After the first voltage pulse signal and the second voltage pulse signal are processed by the back-end circuit, the rotation information about the magnet 10 is obtained. The rotation information contains the information about the turn number of rotating the magnet 10 and the rotation direction of the magnet 10.

The operations of the rotation detecting device 1 will be described as follows.

Firstly, the magnet 10 is rotated about the rotation axis C for one turn (i.e., rotated from 0 to 360 degrees). When the rotation angle of the magnet 10 is (90+θ) degrees or (270+θ) degrees, the first magnetic sensing assembly 11 generates the first voltage pulse signal. When the rotation angle of the magnet 10 is 0 degree or 180 degrees, the second magnetic sensing assembly 12 generates the second voltage pulse signal. In an embodiment, the magnetic characteristic of the magnet 10 is the magnetic flux density. Similarly, the magnet 10 is rotated about the rotation axis C for one turn (i.e., rotated from 0 to 360 degrees). When the rotation angle of the magnet 10 is (90+θ) degrees or (270+θ) degrees, the first magnetic sensing assembly 11 senses the direction change of the magnetic flux density. When the rotation angle of the magnet 10 is 0 degree or 180 degrees, the second magnetic sensing assembly 12 senses the direction change of the magnetic flux density.

In an embodiment, the included angle α between the second lengthwise direction L2 of the second magnetic sensing assembly 12 and the first lengthwise direction L1 of the first magnetic sensing assembly 11 is (90+θ) degrees, wherein −30≤θ≤30. Preferably, the included angle α between the second lengthwise direction L2 of the second magnetic sensing assembly 12 and the first lengthwise direction L1 of the first magnetic sensing assembly 11 is 90 degrees. That is, θ is zero.

Figure 4B:
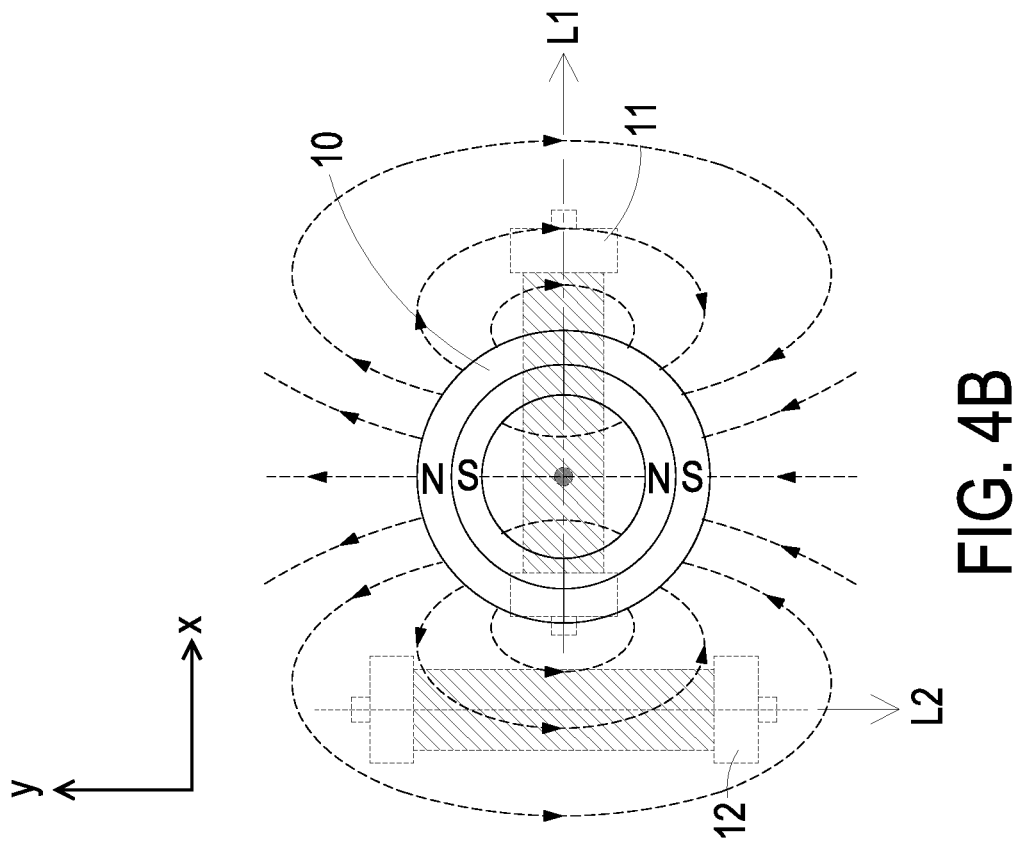
FIG. 4B is a schematic top view illustrating the magnetic flux density distribution of the rotation detecting device, in which the rotation angle of the magnet is 90 degrees.
Figure 4A:
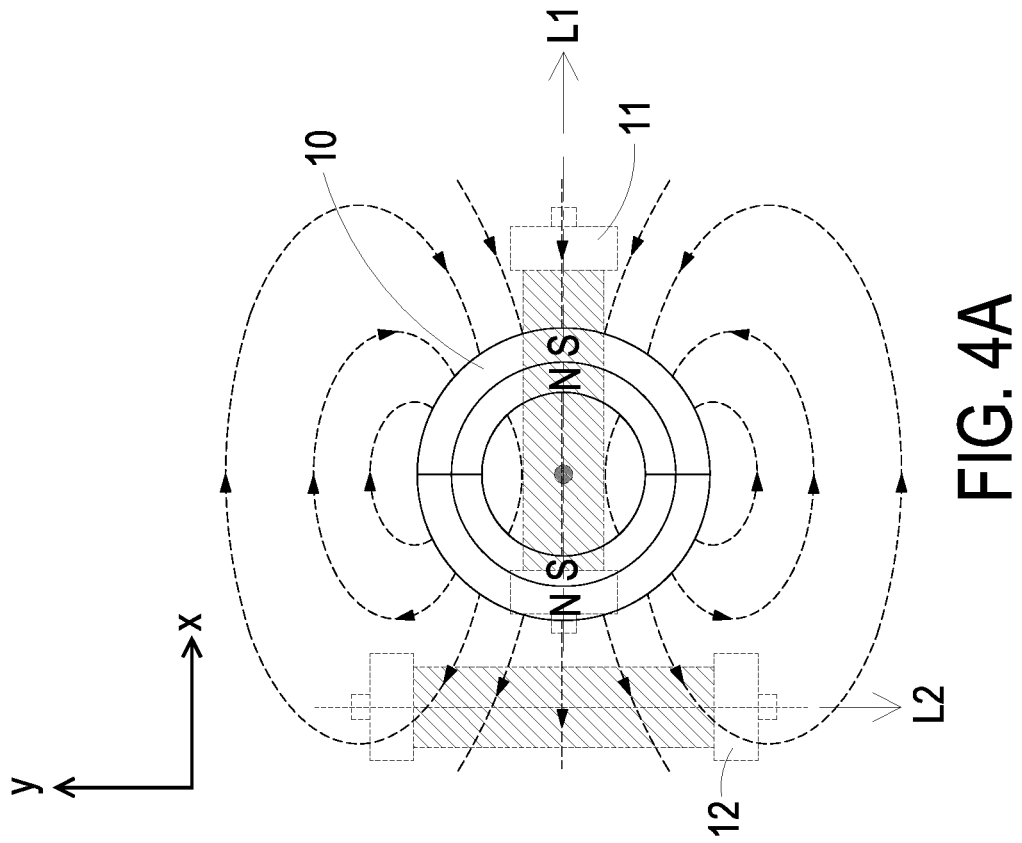
FIG. 4A is a schematic top view illustrating the magnetic flux density distribution of the rotation detecting device, in which the rotation angle of the magnet is 0 degree.
Figure 4D:
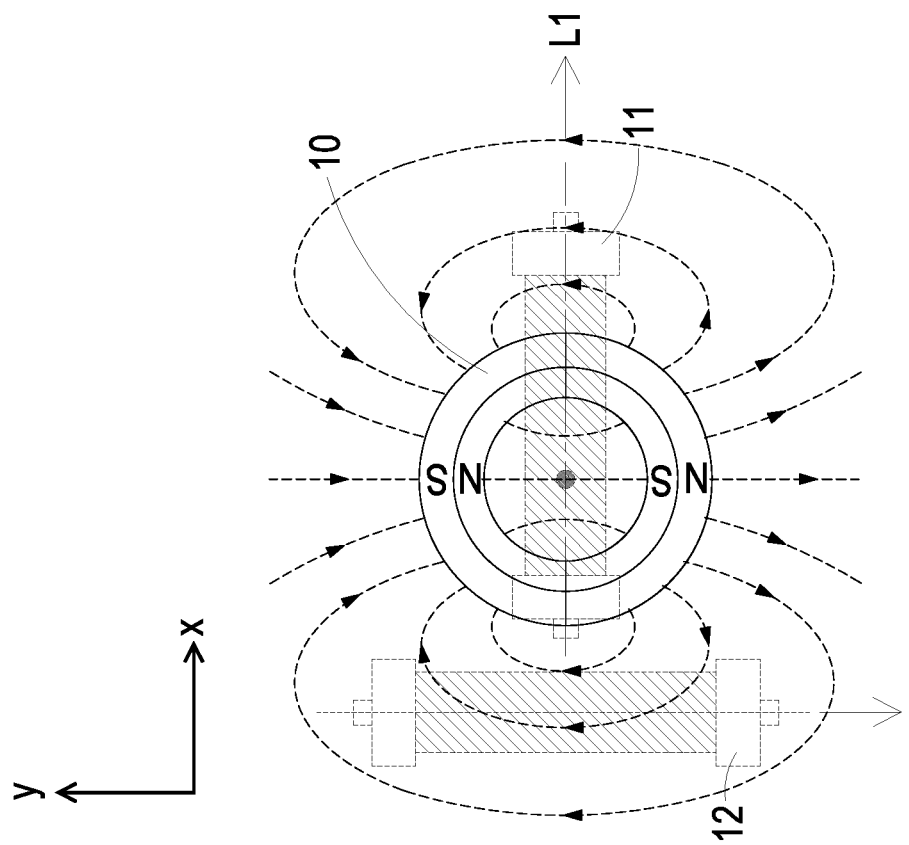
FIG. 4D is a schematic top view illustrating the magnetic flux density distribution of the rotation detecting device, in which the rotation angle of the magnet is 270 degrees.
Figure 4C:
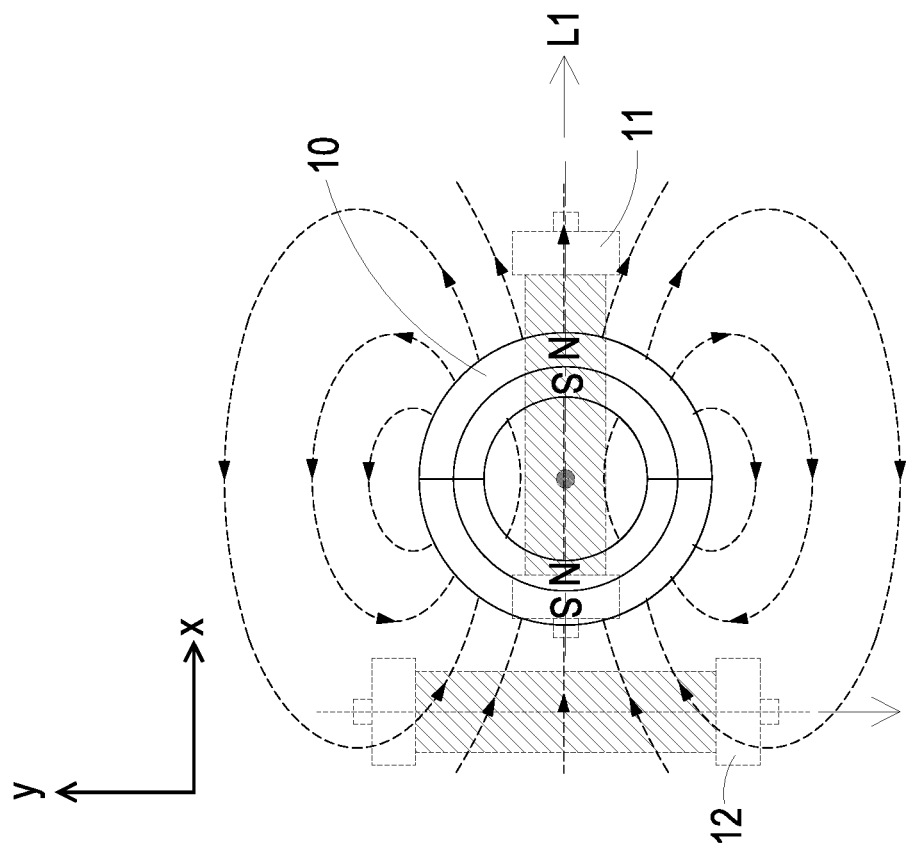
FIG. 4C is a schematic top view illustrating the magnetic flux density distribution of the rotation detecting device, in which the rotation angle of the magnet is 180 degrees.

Please refer to FIGS. 4A, 4B, 4C and 4D. FIG. 4A is a schematic top view illustrating the magnetic flux density distribution of the rotation detecting device, in which the rotation angle of the magnet is 0 degree. FIG. 4B is a schematic top view illustrating the magnetic flux density distribution of the rotation detecting device, in which the rotation angle of the magnet is 90 degrees. FIG. 4C is a schematic top view illustrating the magnetic flux density distribution of the rotation detecting device, in which the rotation angle of the magnet is 180 degrees. FIG. 4D is a schematic top view illustrating the magnetic flux density distribution of the rotation detecting device, in which the rotation angle of the magnet is 270 degrees. In these drawings, the x-axis direction is the horizontal direction, and the y-axis direction is the vertical direction.

As shown in FIGS. 4A and 4C, the rotation angles of the magnet 10 are 0 degree and 180 degrees, respectively. The magnetic flux line sensed by the middle region of the second magnetic sensing assembly 12 is perpendicular to the second lengthwise direction L2. Moreover, the magnetic flux lines along the +y direction and the −y direction are symmetrical to each other. Consequently, the magnetic flux density sensed by the overall second magnetic sensing assembly 12 is zero.

As shown in FIG. 4B, the rotation angle of the magnet 10 is 90 degrees. The highest magnetic flux density sensed by the overall second magnetic sensing assembly 12 along the −y direction is By. As shown in FIG. 4D, the rotation angle of the magnet 10 is 270 degrees. The highest magnetic flux density sensed by the overall second magnetic sensing assembly 12 along the +y direction is By.

Figure 5A:
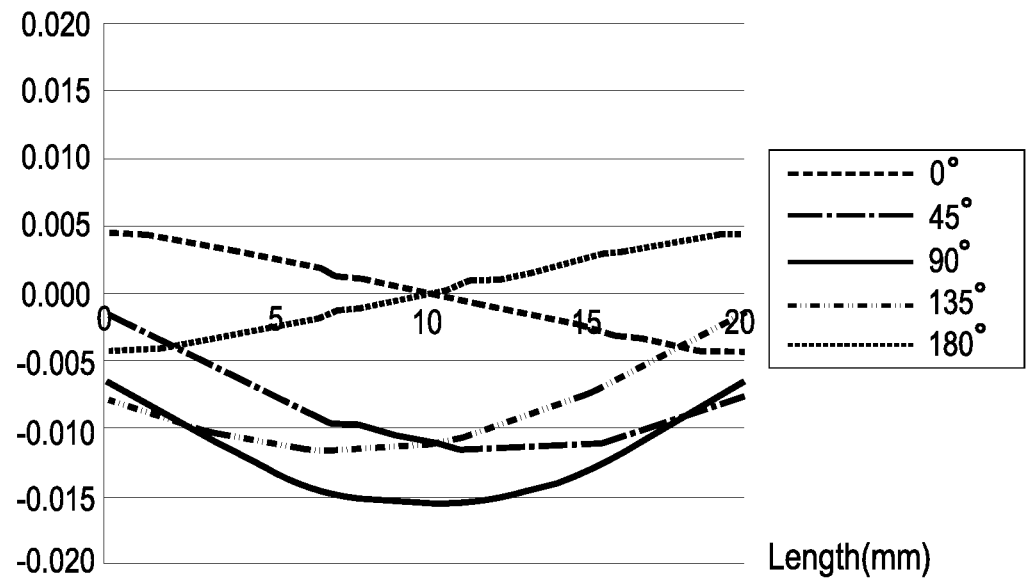
FIG. 5A is a plot illustrating the relationships between the magnetic flux density and the length of the second magnetic sensing assembly when the rotation angle of the magnet is 0, 45, 90, 135 or 180 degrees.
Figure 5B:
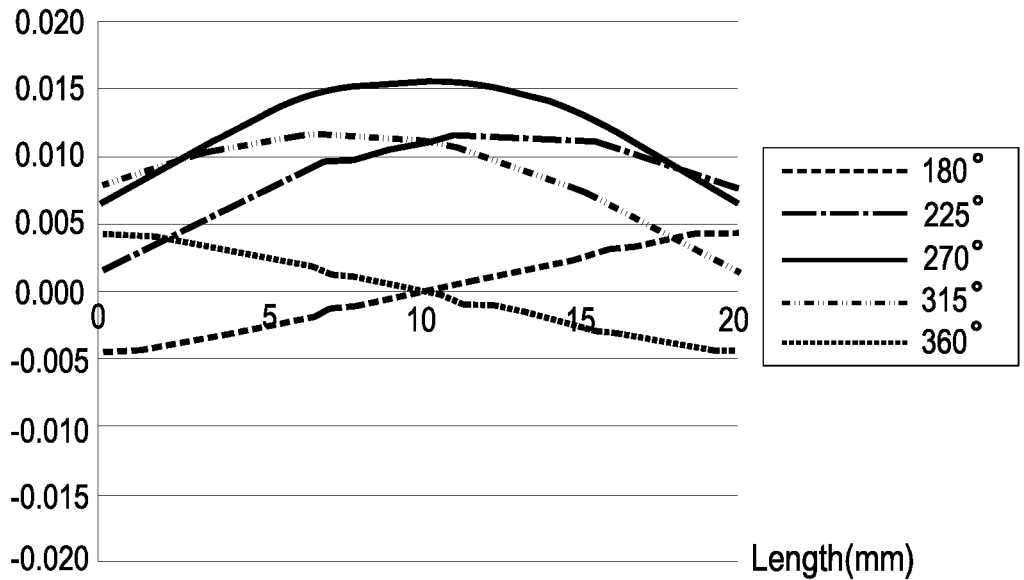
FIG. 5B is a plot illustrating the relationships between the magnetic flux density and the length of the second magnetic sensing assembly when the rotation angle of the magnet is 180, 225, 270, 315 or 360 degrees.

FIG. 5A is a plot illustrating the relationships between the magnetic flux density and the length of the second magnetic sensing assembly when the rotation angle of the magnet is 0, 45, 90, 135 or 180 degrees. FIG. 5B is a plot illustrating the relationships between the magnetic flux density and the length of the second magnetic sensing assembly when the rotation angle of the magnet is 180, 225, 270, 315 or 360 degrees. When the rotation angle of the magnet 10 is 0 degree or 180 degree, the magnetic flux densities corresponding to the length of the second magnetic sensing assembly 12 are in symmetric distribution with respect to the central point M of the second magnetic sensing assembly 12 (i.e., the length as shown in the drawings is 10 mm). Consequently, the magnetic flux density sensed by the overall second magnetic sensing assembly 12 is zero. When the rotation angle of the magnet 10 is 90 degrees, the highest negative value of the magnetic flux density is sensed by the overall second magnetic sensing assembly 12. When the rotation angle of the magnet 10 is 270 degrees, the highest positive value of the magnetic flux density is sensed by the overall second magnetic sensing assembly 12. As the magnet 10 is rotated for one turn in a clockwise direction, the rotation angles of the magnet 10 are 0, 90, 180 and 270 degrees sequentially and returned to 0 degree (or 360 degrees). That is, the magnetic flux densities sensed by the overall second magnetic sensing assembly 12 are 0, −By, 0 and +By and 0 sequentially and restored to 0.

Figure 6A:
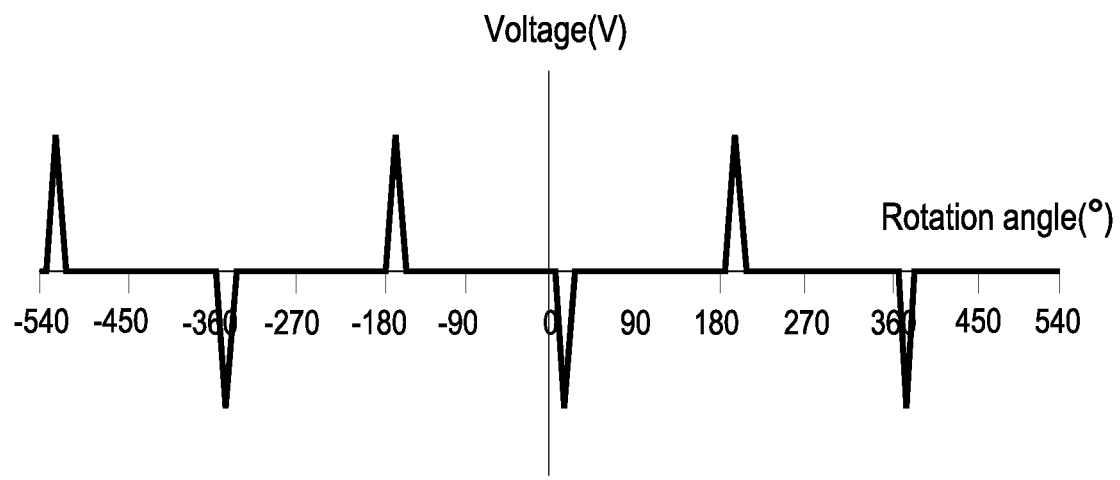
FIG. 6A is a plot illustrating the relationship between the voltage and the rotation angle of the second voltage pulse signal when the magnet of the rotation detecting device is rotated in the clockwise direction.

As the magnet 10 is rotated for one turn in the clockwise direction, the second magnetic sensing assembly 12 senses the direction change of the magnetic flux density at the rotation angles of 0 degree (or 360 degrees) and 180 degrees. Correspondingly, the second magnetic sensing assembly 12 generates the second voltage pulse signal. When the magnet of the rotation detecting device is rotated in the clockwise direction, the relationship between the voltage and the rotation angle of the second voltage pulse signal is shown in FIG. 6A.

Figure 6B:
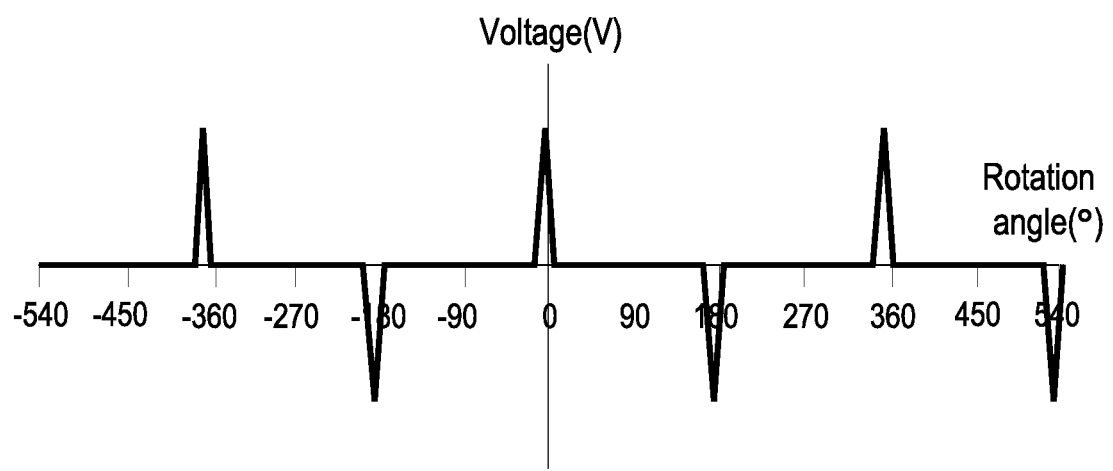
FIG. 6B is a plot illustrating the relationship between the voltage and the rotation angle of the second voltage pulse signal when the magnet of the rotation detecting device is rotated in the counterclockwise direction.

FIG. 6B is a plot illustrating the relationship between the voltage and the rotation angle of the second voltage pulse signal when the magnet of the rotation detecting device is rotated in the counterclockwise direction. Similarly, as the magnet 10 is rotated for one turn in the counterclockwise direction, the second magnetic sensing assembly 12 senses the direction change of the magnetic flux density at the rotation angles of 0 degree (or 360 degrees) and 180 degrees. Correspondingly, the second magnetic sensing assembly 12 generates the second voltage pulse signal. The signs of the second voltage pulse signal corresponding to the counterclockwise rotation of the magnet 10 at different rotation angles are opposite to the signs of the second voltage pulse signal corresponding to the clockwise rotation of the magnet 10 at different rotation angles. That is, the second voltage pulse signal as shown in FIG. 6B is opposite to the second voltage pulse signal as shown in FIG. 6A. Moreover, due to the hysteresis effect of the second magnetic sensing assembly 12, the pulse positions are slightly shifted. The pulse position shift may be compensated by the back-end circuit.

Please refer to FIGS. 7A and 7B as well as FIGS. 4A to 4D. FIG. 7A is a schematic side view illustrating the magnetic flux density distribution of the rotation detecting device, in which the rotation angle of the magnet is 0 degree. FIG. 7B is a schematic side view illustrating the magnetic flux density distribution of the rotation detecting device, in which the rotation angle of the magnet is 180 degrees. In these drawings, the x-axis direction is the horizontal direction, and the z-axis direction (i.e., the thickness direction) is the vertical direction.

As shown in FIG. 7A, the rotation angle of the magnet 10 is 0 degree. The highest magnetic flux density sensed by the first magnetic sensing assembly 11 along the +x direction is Bx. As shown in FIG. 7B, the rotation angle of the magnet 10 is 180 degree. The highest magnetic flux density sensed by the first magnetic sensing assembly 11 along the −x direction is Bx. As shown in FIGS. 4B and 4D, the rotation angles of the magnet 10 are 90 degree and 270 degrees, respectively. The magnetic flux line sensed by the first magnetic sensing assembly 11 is substantially perpendicular to the first lengthwise direction L1. The magnetic flux density sensed by the first magnetic sensing assembly 11 is zero.

Figure 8A:
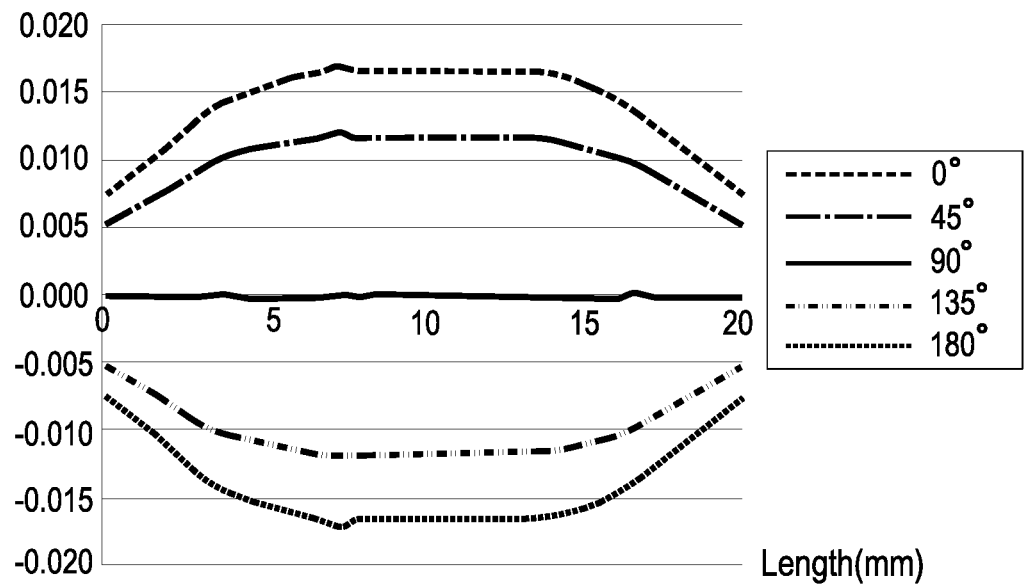
FIG. 8A is a plot illustrating the relationships between the magnetic flux density and the length of the first magnetic sensing assembly when the rotation angle of the magnet is 0, 45, 90, 135 or 180 degrees.
Figure 8B:
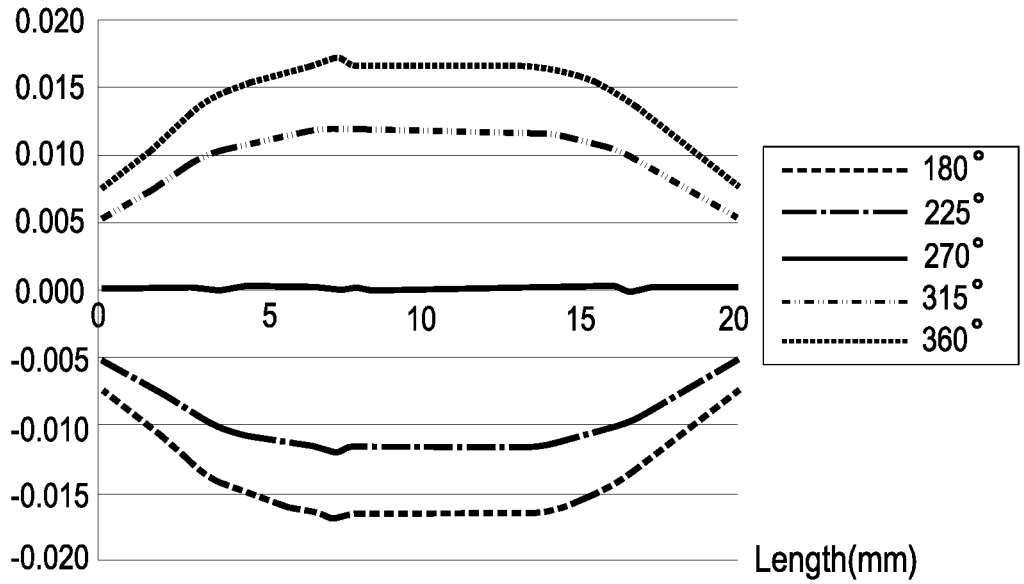
FIG. 8B is a plot illustrating the relationships between the magnetic flux density and the length of the first magnetic sensing assembly when the rotation angle of the magnet is 180, 225, 270, 315 or 360 degrees.

FIG. 8A is a plot illustrating the relationships between the magnetic flux density and the length of the first magnetic sensing assembly when the rotation angle of the magnet is 0, 45, 90, 135 or 180 degrees. FIG. 8B is a plot illustrating the relationships between the magnetic flux density and the length of the first magnetic sensing assembly when the rotation angle of the magnet is 180, 225, 270, 315 or 360 degrees. When the rotation angle of the magnet 10 is 90 degrees or 270 degree, the magnetic flux densities corresponding to the length of the first magnetic sensing assembly 11 is zero. When the rotation angle of the magnet 10 is 0 degree, the highest positive value of the magnetic flux density is sensed by the first magnetic sensing assembly 11. When the rotation angle of the magnet 10 is 180 degrees, the highest negative value of the magnetic flux density is sensed by the first magnetic sensing assembly 11.

Figure 9A:
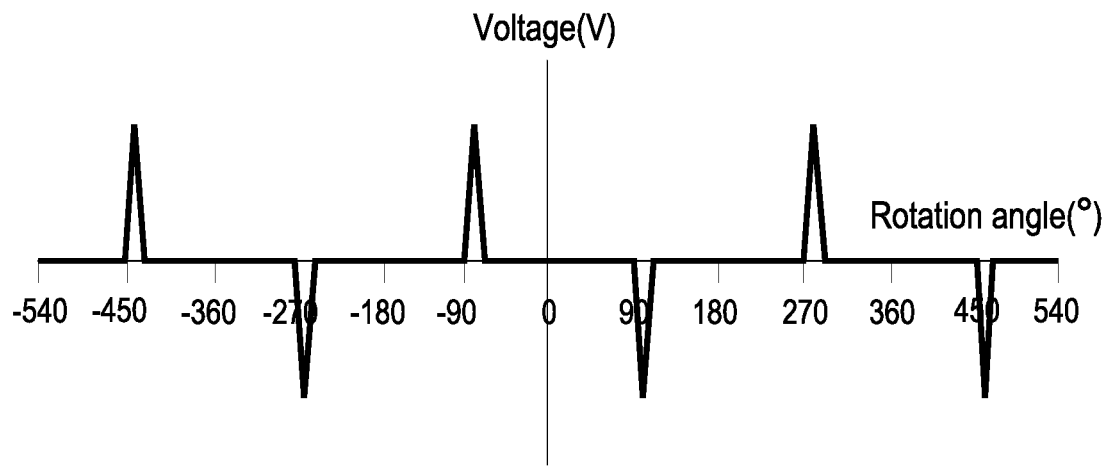
FIG. 9A is a plot illustrating the relationship between the voltage and the rotation angle of the first voltage pulse signal when the magnet of the rotation detecting device is rotated in the clockwise direction.

As the magnet 10 is rotated for one turn in a clockwise direction, the rotation angles of the magnet 10 are 0, 90, 180 and 270 degrees sequentially and returned to 0 degree (or 360 degrees). That is, the magnetic flux densities sensed by the overall second magnetic sensing assembly 12 are Bx, 0, −Bx and 0 sequentially and restored to Bx. As the magnet 10 is rotated for one turn in the clockwise direction, the first magnetic sensing assembly 11 senses the direction change of the magnetic flux density at the rotation angles of 90 degrees and 270 degrees. Correspondingly, the first magnetic sensing assembly 11 generates the first voltage pulse signal. When the magnet of the rotation detecting device is rotated in the clockwise direction, the relationship between the voltage and the rotation angle of the first voltage pulse signal is shown in FIG. 9A.

Figure 9B:
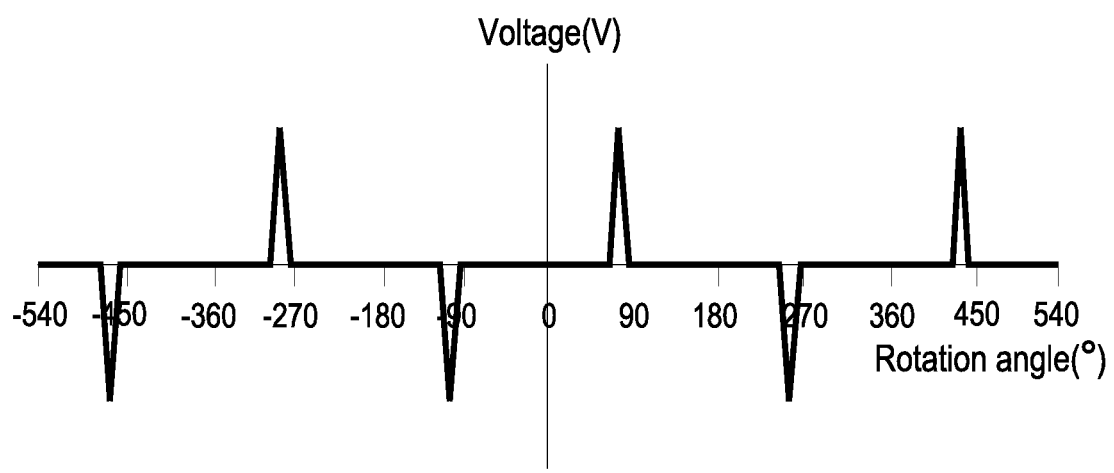
FIG. 9B is a plot illustrating the relationship between the voltage and the rotation angle of the first voltage pulse signal when the magnet of the rotation detecting device is rotated in the counterclockwise direction.

FIG. 9B is a plot illustrating the relationship between the voltage and the rotation angle of the first voltage pulse signal when the magnet of the rotation detecting device is rotated in the counterclockwise direction. Similarly, as the magnet 10 is rotated for one turn in the counterclockwise direction, the first magnetic sensing assembly 11 senses the direction change of the magnetic flux density at the rotation angles of 90 degrees and 270 degrees. Correspondingly, the first magnetic sensing assembly 11 generates the first voltage pulse signal. The signs of the first voltage pulse signal corresponding to the counterclockwise rotation of the magnet 10 at different rotation angles are opposite to the signs of the first voltage pulse signal corresponding to the clockwise rotation of the magnet 10 at different rotation angles. That is, the first voltage pulse signal as shown in FIG. 9B is opposite to the first voltage pulse signal as shown in FIG. 9A. Moreover, due to the hysteresis effect of the first magnetic sensing assembly 11, the pulse positions are slightly shifted. The pulse position shift may be compensated by the back-end circuit.

Consequently, as the magnet 10 of the rotation detecting device is rotated about the rotation axis C for one turn, the first voltage pulse signal and the second voltage pulse signal are generated. When the rotation angle of the magnet 10 is 90 degrees or 270 degrees, the first magnetic sensing assembly 11 generates the first voltage pulse signal. When the rotation angle of the magnet 10 is 0 degree (or 360 degrees) or 180 degrees, the second magnetic sensing assembly 12 generates the second voltage pulse signal. That is, the phase difference between the first voltage pulse signal and the second voltage pulse signal is 90 degrees. After the first voltage pulse signal and the second voltage pulse signal are processed by a back-end circuit, a rotation information about the magnet 10 is obtained. The rotation information contains the information about the turn number of rotating the magnet 10 and the rotation direction of the magnet 10.

As mentioned above, the rotation detecting device includes the first magnetic sensing assembly and the second magnetic sensing assembly. The included angle α between the second lengthwise direction of the second magnetic sensing assembly and the first lengthwise direction of the first magnetic sensing assembly is in the range between 60 degrees and 120 degrees. Even if the rotation detecting device has less number of components and the simplified configuration, the occupied space is reduced and the volume is minimized. When the rotation angle of the magnet 10 is (90+θ) degrees or (270+θ) degrees, the first magnetic sensing assembly 11 generates the first voltage pulse signal. When the rotation angle of the magnet 10 is 0 degree or 180 degrees, the second magnetic sensing assembly 12 generates the second voltage pulse signal. After the first voltage pulse signal and the second voltage pulse signal are processed, the precise rotation information of the magnet 10 is obtained.

Figure 10:
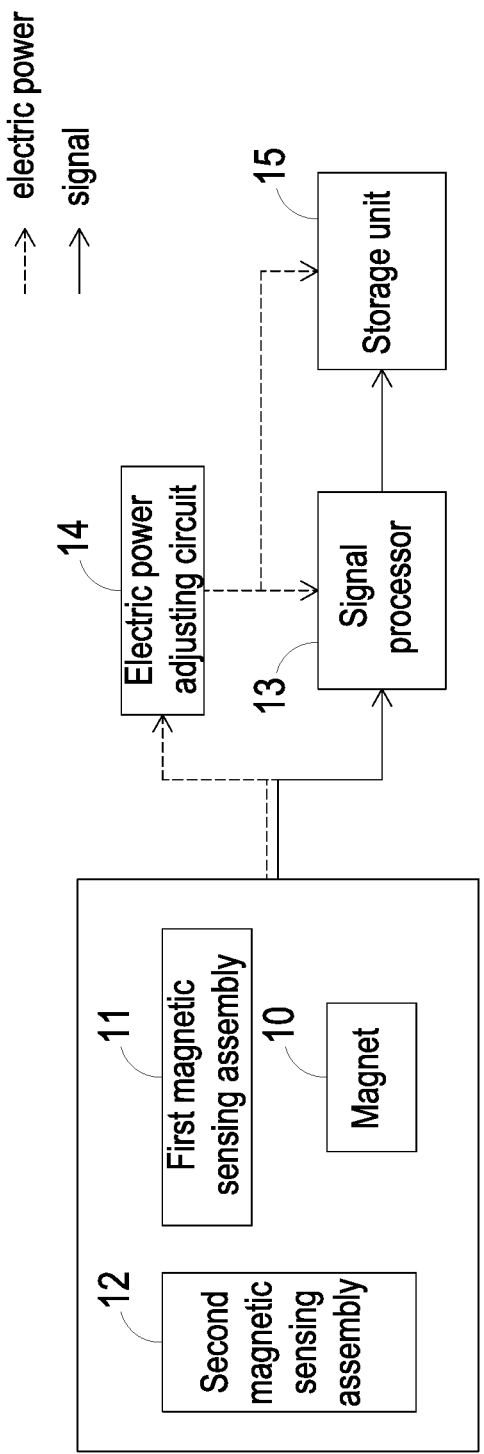
FIG. 10 is a schematic functional block diagram illustrating the architecture of the rotation detecting device according to the embodiment of the present disclosure.

Please refer to FIGS. 1A, 1B and 10. FIG. 10 is a schematic functional block diagram illustrating the architecture of the rotation detecting device according to the embodiment of the present disclosure. The rotation detecting device 1 further includes a signal processor 13. The signal processor 13 is electrically connected with the first magnetic sensing assembly 11 and the second magnetic sensing assembly 12. After the first voltage pulse signal from the first magnetic sensing assembly 11 and the second voltage pulse signal from the second magnetic sensing assembly 12 are received and analyzed by the signal processor 13, the rotation information of the magnet 10 is obtained.

In some embodiments, the rotation detecting device 1 further includes an electric power adjusting circuit 14 and a storage unit 15. The electric power adjusting circuit 14 is electrically connected with the first magnetic sensing assembly 11, the second magnetic sensing assembly 12 and the signal processor 13. The electric power adjusting circuit 14 receives the first voltage pulse signal and the second voltage pulse signal and adjusts the voltage levels of the first voltage pulse signal and the second voltage pulse signal. The storage unit 15 is electrically connected with the signal processor 13 and the electric power adjusting circuit 14. The storage unit 15 and the signal processor 13 are powered by the electric power adjusting circuit 14. The rotation information is transmitted from the signal processor 13 to the storage unit 15 and stored in the storage unit 15.

After the first voltage pulse signal from the first magnetic sensing assembly 11 and the second voltage pulse signal from the second magnetic sensing assembly 12 are received by the electric power adjusting circuit 14, the voltage levels of the first voltage pulse signal and the second voltage pulse signal are adjusted. Consequently, the storage unit 15 and the signal processor 13 are powered by the electric power adjusting circuit 14. After the first voltage pulse signal from the first magnetic sensing assembly 11 and the second voltage pulse signal from the second magnetic sensing assembly 12 are received by the signal processor 13, the first voltage pulse signal and the second voltage pulse signal are analyzed and processed by the signal processor 13. Consequently, the rotation information of the magnet 10 is obtained. The rotation information of the magnet 10 is stored in the storage unit 15. In an embodiment, the storage unit 15 is a non-volatile memory. In case that no electric power is provided to the storage unit 15, the rotation information of the magnet 10 stored in the storage unit 15 is not lost. After the storage unit 15 is powered on again, the rotation information is provided to and read by the signal processor 13. In other words, even if the rotation detecting device 1 is not equipped with a battery or the rotation detecting device 1 is not connected with an external power supply, the rotation detecting device 1 can be normally operated.

As mentioned above, the rotation detecting device integrates the electric power adjusting circuit and the storage unit. The voltage pulse signals are provided to the electric power adjusting circuit and the signal processor. The rotation information of the magnet 10 is temporarily stored in the storage unit 15. Consequently, it is not necessary to apply external electric power to detect the rotation of the magnet.

Figure 11:
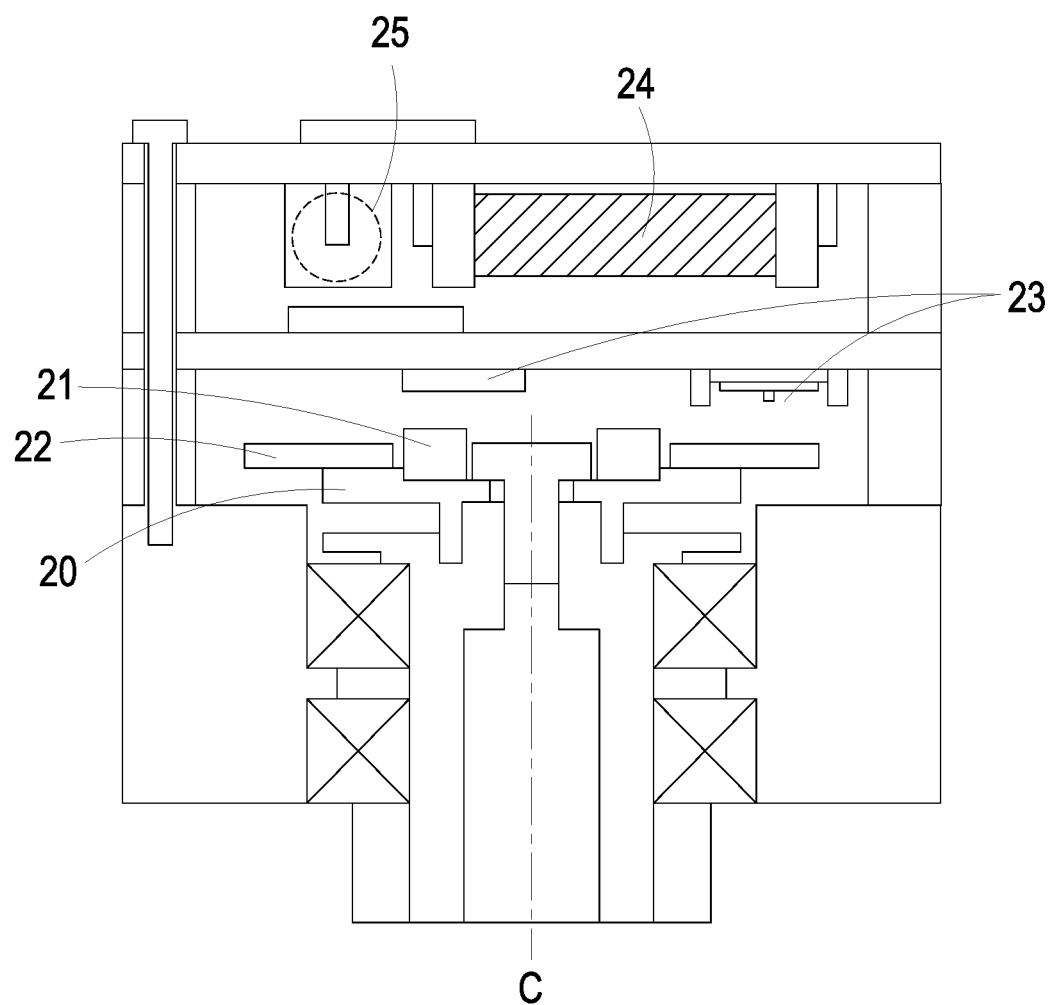
FIG. 11 is a schematic cross-sectional view illustrating an encoder with the rotation detecting device of the present disclosure.

The present disclosure further provides a multi-turn absolute-type encoder. The multi-turn absolute-type encoder is a combination of the rotation detecting device and a single-turn absolute-type encoder. FIG. 11 is a schematic cross-sectional view illustrating an encoder with the rotation detecting device of the present disclosure. As shown in FIG. 11, the encoder 2 includes a carrier disc 20, a magnet 21, an encoding disc 22, a single-turn absolute-type position sensor 23, a first magnetic sensing assembly 24 and a second magnetic sensing assembly 25. The magnet 21 is installed on the carrier disc 20. Moreover, the magnet 21 has magnetic characteristics. As the magnet 21 is rotated for one turn, the magnetic characteristics are correspondingly changed for a cycle. The encoding disc 22 is installed on the carrier disc 20. Moreover, the carrier disc 20 is arranged around the magnet 21. The encoding disc 22 and the magnet 21 are coaxial and rotatable about a rotation axis C. The single-turn absolute-type position sensor 23 is aligned with the encoding disc 22 and the magnet 21. While the encoding disc 22 and the magnet 21 are rotated, the single-turn absolute-type position sensor 23 senses the rotation of the encoding disc 22 and the magnet 21. Consequently, a single-turn absolute position signal is generated. The first magnetic sensing assembly 24 and the second magnetic sensing assembly 25 are located over the single-turn absolute-type position sensor 23. While the magnet 21 is rotated, the first magnetic sensing assembly 24 and the second magnetic sensing assembly 25 generate the first voltage pulse signal and the second voltage pulse signal according to the magnetic characteristic changes of the magnet 21. The relative positions between the first magnetic sensing assembly 24, the second magnetic sensing assembly 25 and the magnet 21 are similar to those of the rotation detecting device 1, and are not redundantly described herein.

The encoder 2 further includes a signal processor. The signal processor is electrically connected with the single-turn absolute-type position sensor 23, the first magnetic sensing assembly 24 and the second magnetic sensing assembly 25. After the single-turn absolute position signal is processed by the signal processor, a single-turn absolute position information $\theta_{ST}$ is generated. The single-turn absolute position information $\theta_{ST}$ is a mechanical angle in the range between 0 degree and 360 degrees. After the first voltage pulse signal and the second voltage pulse signal are processed by the signal processor, the rotation information N of the magnet is obtained, wherein N is the number of rotation turns. After the single-turn absolute position information $\theta_{ST}$ and the rotation information N are processed by the signal processor, a multi-turn absolute position information $\theta_{MT}$ is obtained, wherein $\theta_{MT}=\theta_{ST}+N\times360°$.

In some embodiments, the encoder 2 further includes an electric power adjusting circuit and a storage unit. The operations of the signal processor, the electric power adjusting circuit and the storage unit are similar to those of FIG. 10, and are not redundantly described herein. In case that no electric power is provided to the storage unit, the rotation information (e.g., the rotation information N) of the magnet 21 stored in the storage unit is not lost. After the storage unit is powered on again, the rotation information is provided to and read by the signal processor. Then, the rotation information and the single-turn absolute position information $\theta_{ST}$ are combined together. In other words, even if the encoder 2 is not equipped with a battery or the encoder 2 is not connected with an external power supply, the encoder 2 can be normally operated.

In an embodiment, the encoder 2 has a reflective-type optical configuration. The single-turn absolute position signal is generated by at least one absolute position pattern of the encoding disc and at least one absolute position light-receiving region of a light receiver. Alternatively, the single-turn absolute position signal is generated by a magnetic-type angle sensor and a magnet. It is noted that the way of generating the single-turn absolute position signal is not restricted. In some other embodiments, the multi-turn absolute-type encoder is a combination of the rotation detecting device and the single-turn absolute-type encoder with a transmissive-type optical configuration or a magnetic-type sensing configuration.

Figure 12:
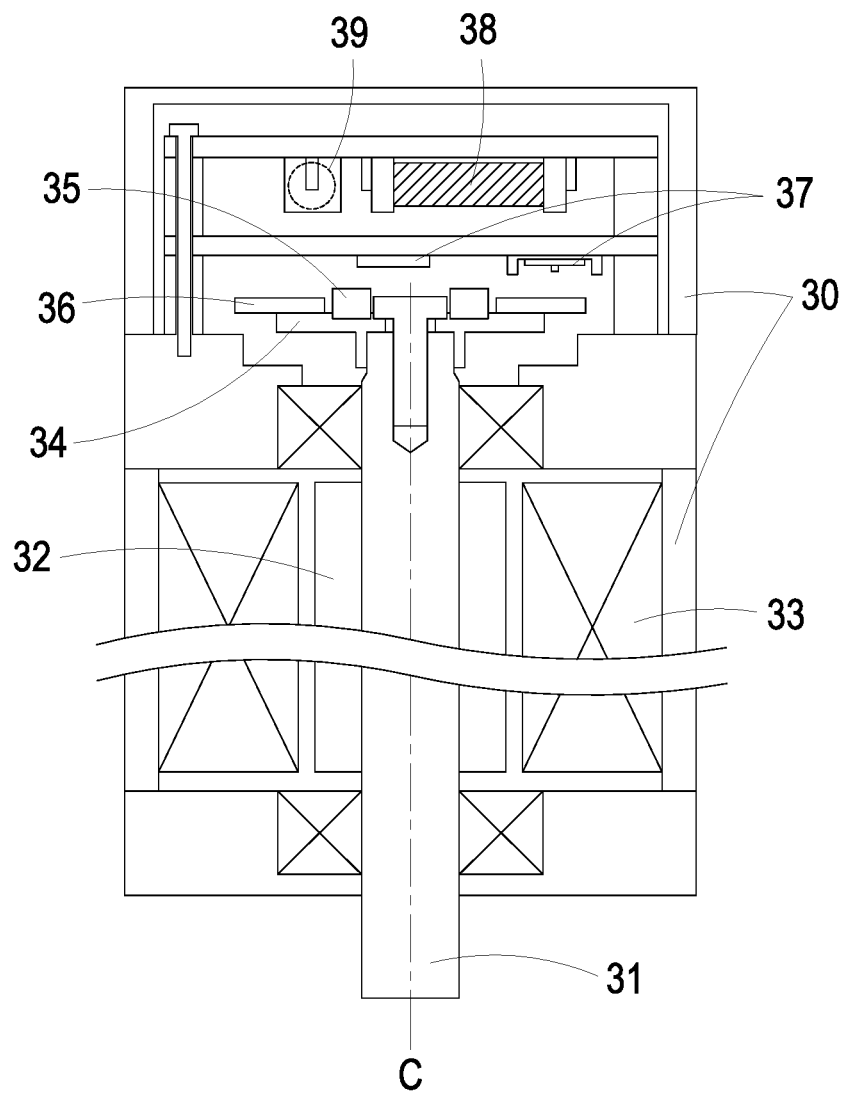
FIG. 12 is a schematic cross-sectional view illustrating a motor with the rotation detecting device of the present disclosure.

As mentioned above, the multi-turn absolute-type encoder is a combination of the rotation detecting device and a single-turn absolute-type encoder. The present disclosure further provides a motor. The motor is equipped with a built-in multi-turn absolute-type encoder. Consequently, the inner space of the motor is minimized. FIG. 12 is a schematic cross-sectional view illustrating a motor with the rotation detecting device of the present disclosure. As shown in FIG. 12, the motor 3 includes a frame body 30, a rotation shaft 31, a rotor 32, a stator 33, a carrier disc 34, a magnet 35, an encoding disc 36, a single-turn absolute-type position sensor 37, a first magnetic sensing assembly 38 and a second magnetic sensing assembly 39. The rotation shaft 31 is penetrated through the frame body 30 and arranged along a rotation axis C. The rotor 32 is sheathed around the rotation shaft 31. The stator 33 is disposed on the frame body 30 and aligned with the rotor 32. The carrier disc 34 is disposed on the rotation shaft 31. The relative positions between the carrier disc 34, the magnet 35, the encoding disc 36, the single-turn absolute-type position sensor 37, the first magnetic sensing assembly 38 and the second magnetic sensing assembly 39 of the motor 3 are similar to those of the encoder 2, and are not redundantly described herein.

In some embodiments, the motor 3 further includes a signal processor, an electric power adjusting circuit and a storage unit. The signal processor is electrically connected with the single-turn absolute-type position sensor 37, the first magnetic sensing assembly 38 and the second magnetic sensing assembly 39. The operations of the signal processor, the electric power adjusting circuit and the storage unit are similar to those of FIG. 10, and are not redundantly described herein. In case that no electric power is provided to the storage unit, the rotation information (e.g., the rotation information N) of the magnet 35 stored in the storage unit is not lost. After the storage unit is powered on again, the rotation information is provided to and read by the signal processor. Then, the rotation information and the single-turn absolute position information $\theta_{ST}$ are combined together. In other words, even if the motor 3 is not equipped with a battery or the motor 3 is not connected with an external power supply, the motor 3 can be normally operated.

As mentioned above, the single-turn absolute position information is generated by the single-turn absolute-type position sensor, and the rotation information of the magnet is obtained by the first magnetic sensing assembly and the second magnetic sensing assembly. According to the combination of the rotation information and the single-turn absolute position information, the multi-turn absolute position information is more precise.

From the above descriptions, the present disclosure provides a rotation detecting device and an encoder and a motor with the rotation detecting device. The rotation detecting device includes a first magnetic sensing assembly and a second magnetic sensing assembly. An included angle between a first lengthwise direction of the first magnetic sensing assembly and a second lengthwise direction of the second magnetic sensing assembly is in the range between 60 degrees and 120 degrees. The rotation detecting device has a simplified structure to acquire the accurate rotation status information of a rotating magnet. Consequently, the volume and the occupied space of the rotation detecting device are reduced. When the rotation angle of the magnet is (90+θ) degrees or (270+θ) degrees, the first magnetic sensing assembly generates the first voltage pulse signal. When the rotation angle of the magnet is 0 degree or 180 degrees, the second magnetic sensing assembly generates the second voltage pulse signal. After the first voltage pulse signal and the second voltage pulse signal are processed, the precise rotation information of the magnet is obtained. The rotation detecting device further includes an electric power adjusting circuit and a storage unit. The voltage pulse signals are provided to the electric power adjusting circuit and the signal processor. The rotation information of the magnet is temporarily stored in the storage unit. Consequently, it is not necessary to apply external electric power to detect the rotation of the magnet. The single-turn absolute position information is generated by the single-turn absolute-type position sensor. The rotation information of the magnet is obtained by the first magnetic sensing assembly and the second magnetic sensing assembly. According to the combination of the rotation information and the single-turn absolute position information, the multi-turn absolute position information is more precise.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A rotation detecting device, comprising:
   a magnet rotatable about a rotation axis and having a magnetic characteristic, wherein as the magnet is rotated for one turn, the magnetic characteristic of the magnet is correspondingly changed for a cycle;
   a first magnetic sensing assembly located over the magnet, wherein the rotation axis of the magnet passes through the first magnetic sensing assembly, and a first lengthwise direction of the first magnetic sensing assembly is in parallel with a rotation radius direction of the magnet; and
   a second magnetic sensing assembly arranged beside the first magnetic sensing assembly, wherein a second lengthwise direction of the second magnetic sensing assembly is in parallel with a rotation tangential direction of the magnet, wherein the rotation tangential direction is perpendicular to the rotation radius direction, and an included angle between the second lengthwise direction and the first lengthwise direction is (90+θ) degrees, wherein −30≤θ≤30; each of the first magnetic sensing assembly and the second magnetic sensing assembly includes a magnetic element and a coil,
   wherein while the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal, the first magnetic sensing assembly has a center axis along the first lengthwise direction, and there is an intersection point between the center axis of the first magnetic sensing assembly and the rotation axis, the center axis of the first magnetic sensing assembly passes through a central point of the second magnetic sensing assembly, wherein the central point is a center of the second magnetic sensing assembly,
   wherein a length of the first magnetic sensing assembly in the first lengthwise direction is greater than a diameter of the magnet, and a length of the second magnetic sensing assembly in the second lengthwise direction is greater than the diameter of the magnet.

2. The rotation detecting device according to claim 1, wherein as the magnet is rotated along the rotation axis, the first magnetic sensing assembly generates the first voltage pulse signal when a rotation angle of the magnet is (90+θ) degrees or (270+θ) degrees, wherein as the magnet is rotated along the rotation axis, the second magnetic sensing assembly generates the second voltage pulse signal when the rotation angle of the magnet is 0 degree or 180 degrees.

3. The rotation detecting device according to claim 1, wherein the magnetic characteristic includes a magnetic flux density, wherein as the magnet is rotated along the rotation axis, the first magnetic sensing assembly senses a change of the magnetic flux density when a rotation angle of the magnet is (90+θ) degrees or (270+θ) degrees, wherein as the magnet is rotated along the rotation axis, the second magnetic sensing assembly senses the change of the magnetic flux density when the rotation angle of the magnet is 0 degree or 180 degrees.

4. The rotation detecting device according to claim 1, further comprising a signal processor, wherein the signal processor is electrically connected with the first magnetic sensing assembly and the second magnetic sensing assembly, wherein after the first voltage pulse signal and the second voltage pulse signal are received and analyzed by the signal processor, the rotation information is obtained.

5. The rotation detecting device according to claim 4, further comprising:
an electric power adjusting circuit electrically connected with the first magnetic sensing assembly, the second magnetic sensing assembly and the signal processor, wherein the electric power adjusting circuit receives the first voltage pulse signal and the second voltage pulse signal and adjusts voltage levels of the first voltage pulse signal and the second voltage pulse signal; and
a storage unit electrically connected with the signal processor and the electric power adjusting circuit,
wherein the storage unit and the signal processor are powered by the electric power adjusting circuit, and the rotation information is transmitted from the signal processor to the storage unit and stored in the storage unit.

6. The rotation detecting device according to claim 1, wherein θ is 0 degree, and the second lengthwise direction is perpendicular to the first lengthwise direction.

7. The rotation detecting device according to claim 1, wherein the magnet is radially magnetized along the rotation radius direction.

8. The rotation detecting device according to claim 1, wherein the magnet is axially magnetized along a thickness direction.

9. An encoder, comprising:
a carrier disc;
a magnet installed on the carrier disc and having a magnetic characteristic, wherein as the magnet is rotated for one turn, the magnetic characteristic of the magnet is correspondingly changed for a cycle;
an encoding disc installed on the carrier disc and arranged around the magnet, wherein the carrier disc, the encoding disc and the magnet are coaxial and rotatable about a rotation axis;
a single-turn absolute position sensor aligned with the encoding disc and the magnet, wherein while the encoding disc and the magnet are rotated, the single-turn absolute position sensor senses rotations of the encoding disc and the magnet and generates a single-turn absolute position signal;
a first magnetic sensing assembly located over the magnet, wherein the rotation axis of the magnet passes through the first magnetic sensing assembly, and a first lengthwise direction of the first magnetic sensing assembly is in parallel with a rotation radius direction of the magnet; and
a second magnetic sensing assembly arranged beside the first magnetic sensing assembly, wherein a second lengthwise direction of the second magnetic sensing assembly is in parallel with a rotation tangential direction of the magnet, wherein the rotation tangential direction is perpendicular to the rotation radius direction, and an included angle between the second lengthwise direction and the first lengthwise direction is (90+θ) degrees, wherein $-30 \leq \theta \leq 30$; each of the first magnetic sensing assembly and the second magnetic sensing assembly includes a magnetic element and a coil,
wherein while the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal, the first magnetic sensing assembly has a center axis along the first lengthwise direction, and there is an intersection point between the center axis of the first magnetic sensing assembly and the rotation axis, the center axis of the first magnetic sensing assembly passes through a central point of the second magnetic sensing assembly, wherein the central point is a center of the second magnetic sensing assembly,
wherein a length of the first magnetic sensing assembly in the first lengthwise direction is greater than a diameter of the magnet, and a length of the second magnetic sensing assembly in the second lengthwise direction is greater than the diameter of the magnet.

10. The encoder according to claim 9, further comprising a signal processor, wherein the signal processor is electrically connected with the single-turn absolute position sensor, the first magnetic sensing assembly and the second magnetic sensing assembly, wherein after the single-turn absolute position signal and the rotation information are processed by the signal processor, a multi-turn absolute position information is obtained.

11. The encoder according to claim 10, further comprising:
an electric power adjusting circuit electrically connected with the first magnetic sensing assembly, the second magnetic sensing assembly and the signal processor, wherein the electric power adjusting circuit receives the first voltage pulse signal and the second voltage pulse signal and adjusts voltage levels of the first voltage pulse signal and the second voltage pulse signal; and
a storage unit electrically connected with the signal processor and the electric power adjusting circuit,
wherein the storage unit and the signal processor are powered by the electric power adjusting circuit, and the rotation information is transmitted from the signal processor to the storage unit and stored in the storage unit.

12. A motor, comprising:
a frame body;
a rotation shaft penetrated through the frame body and arranged along a rotation axis;
a rotor sheathed around the rotation shaft;
a stator disposed on the frame body and aligned with the rotor;
a carrier disc disposed on the rotation shaft;
a magnet installed on the carrier disc and having a magnetic characteristic, wherein as the magnet is rotated for one turn, the magnetic characteristic of the magnet is correspondingly changed for a cycle;
an encoding disc installed on the carrier disc and arranged around the magnet, wherein the carrier disc, the encoding disc and the magnet are coaxial and rotatable about the rotation axis;
a single-turn absolute position sensor aligned with the encoding disc and the magnet, wherein while the encoding disc and the magnet are rotated, the single-turn absolute position sensor senses rotations of the encoding disc and the magnet and generates a single-turn absolute position signal;

a first magnetic sensing assembly located over the magnet, wherein the rotation axis of the magnet passes through the first magnetic sensing assembly, and a first lengthwise direction of the first magnetic sensing assembly is in parallel with a rotation radius direction of the magnet; and a second magnetic sensing assembly arranged beside the first magnetic sensing assembly, wherein a second lengthwise direction of the second magnetic sensing assembly is in parallel with a rotation tangential direction of the magnet, wherein the rotation tangential direction is perpendicular to the rotation radius direction, and an included angle between the second lengthwise direction and the first lengthwise direction is (90+θ) degrees, wherein −30≤θ≤30; each of the first magnetic sensing assembly and the second magnetic sensing assembly includes a magnetic element and a coil, wherein while the magnet is rotated, the first magnetic sensing assembly generates a first voltage pulse signal according to a change of the magnetic characteristic, the second magnetic sensing assembly generates a second voltage pulse signal according to the change of the magnetic characteristic, and a rotation information of the magnet is obtained according to the first voltage pulse signal and the second voltage pulse signal, the first magnetic sensing assembly has a center axis along the first lengthwise direction, and there is an intersection point between the center axis of the first magnetic sensing assembly and the rotation axis, the center axis of the first magnetic sensing assembly passes through a central point of the second magnetic sensing assembly, wherein the central point is a center of the second magnetic sensing assembly, wherein a length of the first magnetic sensing assembly in the first lengthwise direction is greater than a diameter of the magnet, and a length of the second magnetic sensing assembly in the second lengthwise direction is greater than the diameter of the magnet.

13. The motor according to claim 12, further comprising:

a signal processor electrically connected with the single-turn absolute position sensor, the first magnetic sensing assembly and the second magnetic sensing assembly, wherein after the single-turn absolute position signal and the rotation information are processed by the signal processor, a multi-turn absolute position information is obtained;

an electric power adjusting circuit electrically connected with the first magnetic sensing assembly, the second magnetic sensing assembly and the signal processor, wherein the electric power adjusting circuit receives the first voltage pulse signal and the second voltage pulse signal and adjusts voltage levels of the first voltage pulse signal and the second voltage pulse signal; and a storage unit electrically connected with the signal processor and the electric power adjusting circuit, wherein the storage unit and the signal processor are powered by the electric power adjusting circuit, and the rotation information is transmitted from the signal processor to the storage unit and stored in the storage unit.

* * * * *